(12) United States Patent
Shimazaki et al.

(10) Patent No.: US 7,768,294 B2
(45) Date of Patent: *Aug. 3, 2010

(54) PULSE LATCH CIRCUIT AND SEMICONDUCTOR INTEGRATED CIRCUIT

(75) Inventors: Yasuhisa Shimazaki, Tokyo (JP); Masakazu Nishibori, Tokyo (JP)

(73) Assignee: Renesas Technology Corp., Tokyo (JP)

(*) Notice: Subject to any disclaimer, the term of this patent is extended or adjusted under 35 U.S.C. 154(b) by 194 days.

This patent is subject to a terminal disclaimer.

(21) Appl. No.: 12/171,957

(22) Filed: Jul. 11, 2008

(65) Prior Publication Data

US 2009/0024861 A1    Jan. 22, 2009

Related U.S. Application Data

(63) Continuation of application No. 11/442,273, filed on May 30, 2006, now Pat. No. 7,411,413.

(30) Foreign Application Priority Data

Jun. 1, 2005    (JP) .............................. 2005-161010

(51) Int. Cl.
*H03K 19/00* (2006.01)

(52) U.S. Cl. .......................... 326/16; 326/93; 327/199; 714/726

(58) Field of Classification Search ................. 326/16, 326/93; 327/199, 202; 714/724, 726–727, 714/729
See application file for complete search history.

(56) References Cited

U.S. PATENT DOCUMENTS

| 5,444,404 | A | 8/1995 | Ebzery ...................... 327/185 |
| 5,719,878 | A | 2/1998 | Yu et al. ..................... 714/726 |
| 5,774,473 | A * | 6/1998 | Harley ......................... 714/30 |
| 6,073,260 | A | 6/2000 | Toshiaki ..................... 714/724 |
| 7,038,494 | B2 * | 5/2006 | Morton ........................ 326/93 |
| 7,437,634 | B2 * | 10/2008 | Jaber et al. ................. 714/726 |

FOREIGN PATENT DOCUMENTS

| JP | 10-112635 | 4/1998 |
| JP | 10-267994 | 10/1998 |
| WO | WO 2004/038917 A1 | 5/2004 |

* cited by examiner

*Primary Examiner*—James Cho
(74) *Attorney, Agent, or Firm*—Miles & Stockbridge P.C.

(57) ABSTRACT

The disclosed invention is intended to decrease the power consumption of a pulse latch circuit. A pulse latch circuit that operates in sync with a pulsed clock signal, including a first operation mode in which shifting test pattern scan data is performed and a second operation mode in which shifting the test pattern scan data is not performed, comprises the following circuits: a first latch circuit that is able to latch input data in sync with the clock signal; a second latch circuit that is connected to the first latch circuit and is able to latch the test pattern scan data to be shifted in sync with the clock signal; and a control circuit that stops supply of the clock signal to the second latch circuit during the second operation mode. By thus stopping the supply of the clock signal to the second latch circuit, decrease the power consumption is achieved.

5 Claims, 14 Drawing Sheets

PULSE LATCH CIRCUIT AND SEMICONDUCTOR INTEGRATED CIRCUIT

CROSS-REFERENCE TO RELATED APPLICATION

This application is a continuation of application Ser. No. 11/442,273 filed May 30, 2006, now is issued U.S. Pat. No. 7,411,413. This application also claims priority from Japanese patent application No. 2005-161010 filed Jun. 1, 2005, the content of which is hereby incorporated by reference into this application.

BACKGROUND OF THE INVENTION

The present invention relates to a pulse latch circuit and a power saving technique for use therein and relates to a technique that is effectively applicable to a semiconductor integrated circuit such as, for example, a microcomputer.

Component circuits that are important for performance enhancement and power saving of a semiconductor integrated circuit are memory elements typified by flip-flop (hereinafter abbreviated to "FF") circuits or latch circuits. Here, a "FF circuit" means a memory element that captures an input signal on the rising edge of a clock and a "latch circuit" means a so-called level-sensing type circuit that transfers an input signal to an output terminal during an "H" (high level) period of a clock and retains an output signal during an "L" (low level) period of a clock. A variety of circuits and clock systems have been proposed with the aim of the speed-up and power saving of the FF circuits or latch circuits. As the size of semiconductor integrated circuits becomes larger, adaptation for a technique of a design (design for test, DFT) providing an easy way of testing FF, circuits is becoming necessary from a perspective of the testing cost.

A technique intended for speed-up by replacing the FF circuits by pulse latch circuits is known. For example, according to a technique described in Patent Document 1, in a semiconductor integrated circuit including a clock pulse generating circuit which generates a pulsed clock signal, a predetermined combinational logic circuit, a pulse latch circuit that can latch input data to the pulsed clock signal, located before or after the combinational logic circuit, the influence of uncertainty of the clock edges is eliminated by setting the pulse width of the pulsed clock signal to fulfill a certain condition.

[Patent Document 1] A brochure of Internal Publication No. WO 2004/038917A1

SUMMARY OF THE INVENTION

As mentioned above, due to the fact that the size of semiconductor integrated circuits is becoming larger, adaptation for the technique of a design (design for test, DFT) providing an easy way of testing FF circuits is becoming necessary from a perspective of the testing cost. However, this technique requires additional circuits for, facilitating the testing of FF circuits, thus resulting in an increase in the semiconductor integrated circuit chip and an increase in power consumption.

A single FF circuit commonly consists of a master latch and a slave latch and it is equivalent of two pulse latch circuits. Thus, in order to reduce power consumption and decrease the area occupied by each such circuit, using the pulse latch circuit instead of the FF circuit is considered reasonable.

However, considering operation powered by a battery like a semiconductor integrated circuit that is mounted in a mobile telephone, it has been found by the present inventors that further reduction of power consumption is needed.

An object of the present invention is to provide a technique for reducing power consumption by pulse latch circuits.

The above and other objects and novel features of the present invention will become apparent from the description of the present specification and the accompanying drawings.

Typical aspects of the invention disclosed herein will be summarized below.

[First Aspect] A pulse latch circuit that operates in sync with a pulsed clock signal, including a first operation mode in which shifting test pattern scan data is performed and a second operation mode in which shifting the test pattern scan data is not performed, comprises a first latch circuit that is able to latch input data in sync with the clock signal, a second latch circuit that is connected to the first latch circuit and is able to latch the test pattern scan data to be shifted in sync with the clock signal, and a control circuit that stops supply of the clock signal to the second latch circuit during the second operation mode.

According to the above means, the control circuit stops, the supply of the clock signal to the second latch circuit during the second operation mode. This achieves reduction in power consumption.

[Second Aspect] In the pulse latch circuit of the first aspect, the second latch circuit may be located before the first latch circuit and the pulse latch circuit may further include a selector that is able to selectively supply an output signal of the first latch circuit to the second latch circuit.

[Third Aspect] A pulse latch circuit that operates in sync with a pulsed clock signal, including a first operation mode in which shifting test pattern scan data is performed, a second operation mode in which shifting the test pattern scan data is not performed, and a standby mode in which a partial shutdown of supply voltages takes place, comprises a first latch circuit that is able to latch input data in sync with the clock signal, a second latch circuit that is connected to the first latch circuit and is able to latch the test pattern scan data to be shifted in sync with the clock signal, a control circuit that stops supply of the clock signal to the second latch circuit during the second operation mode and a data retention control circuit for preventing erasure of data latched by the first latch circuit during the standby mode.

According to the above means, the control circuit stops the supply of the clock signal to the second latch circuit during the second operation mode. This achieves reduction in power consumption. The data retention control circuit prevents the erasure of data latched by the first latch circuit during the standby mode. This achieves enhancing the reliability of the pulse latch circuit.

[Fourth Aspect] In the pulse latch circuit of the third aspect, the second latch circuit may be located before the first latch circuit and the pulse latch circuit may further include a selector that is able to selectively supply an output signal of the first latch circuit to the second latch circuit.

[Fifth Aspect] A pulse latch circuit that operates in sync with a pulsed clock signal, including a first operation mode in which shifting test pattern scan data is performed and a second operation mode in which shifting the test pattern scan data is not performed, comprises a first latch circuit that is able to latch input data in sync with the clock signal, a second latch circuit that is connected to the first latch circuit and is able to latch the test pattern scan data to be shifted in sync with the clock signal, a control circuit that stops supply of the clock signal to the second latch circuit during the second operation mode, and a clock control circuit that compares data to be input to the first latch circuit and data latched by the first latch circuit and controls supply of the clock signal to the first latch circuit, based on the result of the comparison.

According to the above means, the control circuit stops the supply of the clock signal to the second latch circuit during the second operation mode. This achieves reduction in power consumption. The clock control circuit compares data to be input to the first latch circuit and data latched by the first latch circuit and controls supply of the clock signal to the first latch circuit, based on the result of the comparison. This achieves further reduction in power consumption.

[Sixth Aspect] In the pulse latch circuit of the fifth aspect, the clock control circuit may stop the supply of the clock signal to the first latch circuit, when the data to be input to the first latch circuit matches the data latched by the first latch circuit.

[Seventh Aspect] In the pulse latch circuit of the fifth or sixth aspect, the second latch circuit may be located before the first latch circuit and the pulse latch circuit may further include a selector that is able to selectively supply an output signal of the first latch circuit to the second latch circuit.

[Eighth Aspect] A semiconductor integrated circuit may be formed on a single semiconductor substrate, including a scan chain formed by concatenating a plurality of pulse latch circuits as defined in any of the first through seventh aspects.

[Ninth Aspect] In a semiconductor integrated circuit formed on a single semiconductor substrate, including a scan chain formed by concatenating a plurality of pulse latch circuits as defined in any of the first through seventh aspects, cells of the pulse latch circuits and cells of other circuits, constituting the semiconductor integrated circuit, may be arranged with a common layout of power supply lines.

Effect that will be achieved by typical aspects of the invention disclosed herein will be briefly described below.

It is thus possible to reduce the power consumption by pulse latch circuits.

DETAILED DESCRIPTION OF THE PREFERRED EMBODIMENTS

Figure 1:
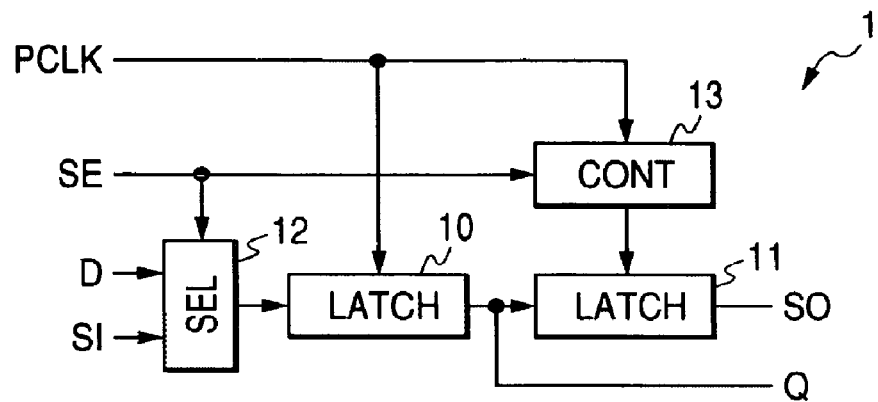
FIG. 1 is a block diagram showing an example of a configuration of a pulse latch circuit according to the present invention.

FIG. 1 shows an example of a configuration of a pulse latch circuit according to the present invention.

A pulse latch circuit 1 shown in FIG. 1 includes, but is not limited to, latch circuits (LATCH) 10, 11, a selector (SEL) 12, and a control circuit (CONT) 13 and is comprised in a semiconductor integrated circuit formed on a monocrystalline silicon substrate by a publicly-known semiconductor integrated circuit manufacturing technique, which is not restrictive.

The selector 12 selectively transfers either of input data D and scan input data S1 for scan shift to the following latch circuit 10 in accordance with a logic of a scan enable signal SE. The latch circuit 10 is located after the selector 12 and placed in a through state during a high level period of a pulsed clock signal (which is referred to as a "pulse clock signal") PCLK. The latch circuit 11 is located after the latch circuit 10 and placed in a through state during a low level period of the pulse clock signal PCLK. The operation of the latch circuit 11 is controlled by the latch control circuit 13. Specifically, while the scan enable signal SE is asserted to a high level, the pulse clock signal PCLK is supplied to the latch circuit 11, thereby making the latch circuit 11 to operate. While the scan enable signal SE is negated to a low level, the pulse clock signal PCLK is not supplied to the latch circuit 11, thereby stopping the operation of the latch circuit 11.

Figure 2:
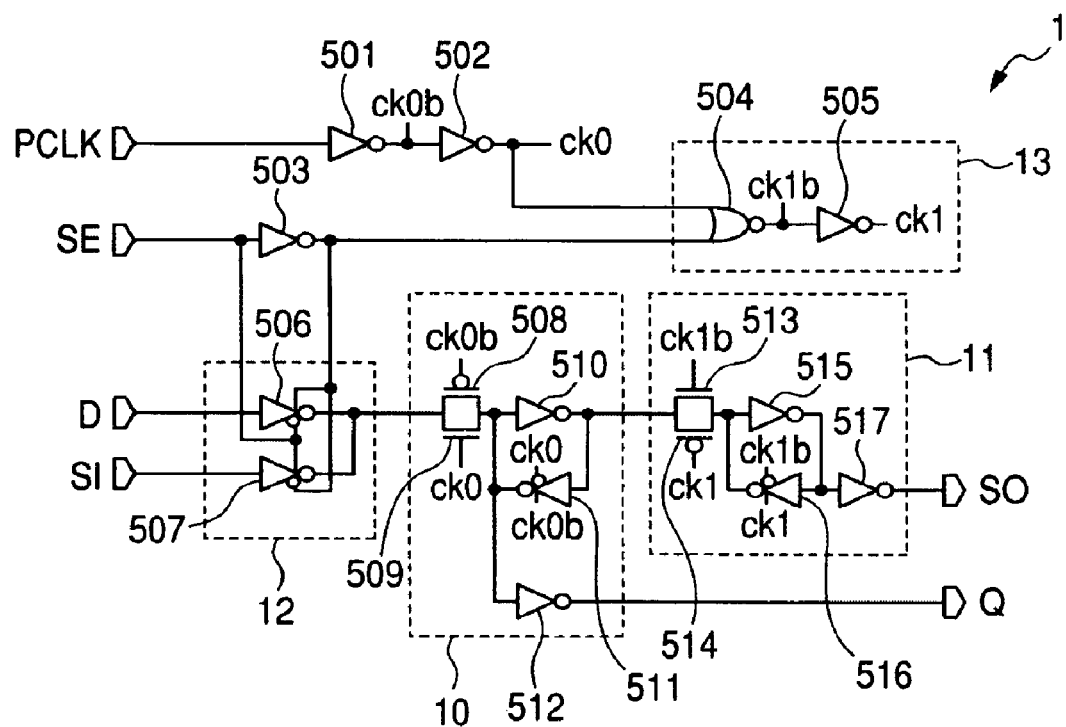
FIG. 2 is a circuit diagram showing an example of a detailed configuration including the structures of the components of the pulse latch circuit shown in FIG. 1.

FIG. 2 shows an example of a detailed configuration including the structures of the components of the pulse latch circuit 1 shown in FIG. 1.

An inverter 501 is provided for logic inversion of the pulse clock signal PCLK and an inverter 502 is provided for inversion of an output logic of the inverter 501. A pulse clock signal ck0b is output from the inverter 501 and a pulse clock signal ck0 is output from the inverter 502. In addition, an inverter 503 is provided for logic inversion of the scan enable signal SE.

The control circuit 13 includes a NOR gate 504 and an inverter 505. The NOR gate 504 produces a NOR logic between an output signal of the inverter 502 and an output signal of the inverter 503. By the NOR gate 504, a clock signal ck1b is generated which is, in turn, logically inverted by the following inverter 505 and output as a clock signal ck1.

The latch circuit 10 is comprised of a p-channel MOS transistor 508, an n-channel MOS transistor 509, inverters 510, 512, and a clocked inverter 511. The p-channel MOS transistor 508 and the n-channel MOS transistor 509 connected in parallel form a transmission gate. The inverter 510 and a tristate buffer 511 connected in a loop form a storing section. The tristate buffer 511 operates in sync with clock signals ck0, ck0b. The inverter 512 is provided for outputting data from the storing section and output data Q is output through this inverter 512.

The latch circuit 11 includes an n-channel MOS transistor 513, p-channel MOS transistor 514, inverters 515, 517, and a clocked inverter 516. The n-channel MOS transistor 513 and the p-channel MOS transistor 514 connected, in parallel form a transmission gate. The inverter 515 and a tristate buffer 516 connected in a loop form a storing section. The tristate buffer 516 operates in sync with clock signals ck1, ck1b. The inverter 517 is provided for outputting data from the storing section and output data SO is output through this inverter 517.

The selector 12 is comprised of tristate buffers 506, 507. The tristate buffers 506, 507 are to be made conductive complementarily by the scan enable signal SE and the output of the inverter 503.

Figure 3:
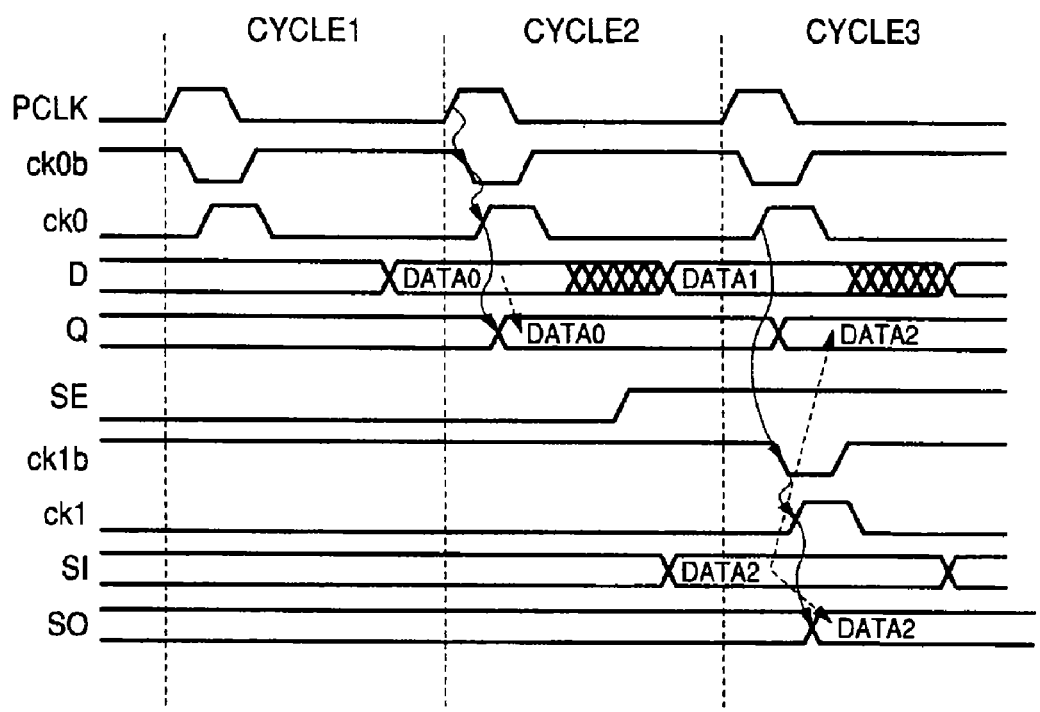
FIG. 3 is a timing chart for the operations of the main parts of the pulse latch circuit shown in FIGS. 1 and 2.

FIG. 3 shows timing for the operations of the main parts of the pulse latch circuit 1 shown in FIGS. 1 and 2.

For CYCLE 2, the scan enable signal SE is L (low level) corresponding to normal operation. During the low level of the SE, input data D (DATA0) selected by the selector 12 is transferred via the latch circuit 10 to the following circuit. When the scan enable signal SE is L, the clock signals ck1b, ck1 do not change. Therefore, the latch 11 is placed in a non-operating state during this period.

Next, for CYCLE 3, the scan enable signal SE is H (high level) corresponding to a scan shift. When the scan enable signal SE is H, the selector 12 selects and transfers the scan input data SI (DATA2) instead of the input data D (DATA1) to the latch circuit 10. The latch circuit 10 latches the scan input data SI (DATA2) in sync with the clock signals ck0b, ck0. When the scan enable signal SE is H, the controller 13 generates clock signals ck1b, ck1. During the high level of the SE, the latch 11 operates in sync with the clock signals ck1b, ck1, thereby implementing the scan shift operation. In fact, the data (DATA2) latched by the latch circuit 10 is output as data output Q and, at the same time, becomes scan output SO via the latch 11 by the operation of the latch 11 in sync with the clock signals ck1b, ck1.

According to the above example of embodiment, a favorable effect can be obtained as below.

Because the operation of the latch circuit 13 for scan shift operation is stopped when the scan enable signal SE is L, power consumption is reduced to about one-half of that during the scan shift operation. Now, assuming that 30% of the operating power of the whole logic circuit is consumed by the clock signal for a FF circuit, this is cut by half by applying the pulse latch circuit 1 of this embodiment and, therefore, the operating power of the whole logic circuit can be reduced by about 15%.

Figure 4:
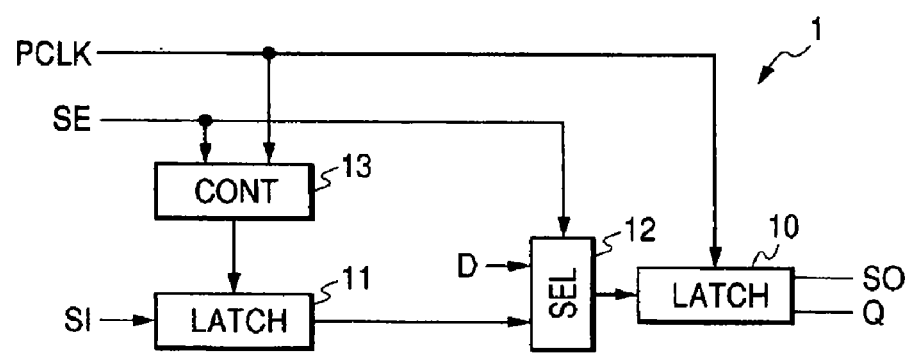
FIG. 4 is a block diagram showing another example of a configuration of a pulse latch circuit according to the present invention.

FIG. 4 shows another example of a configuration of a pulse latch circuit according to the present invention.

A significant difference between the pulse latch circuit 1 shown in FIG. 4 and that shown in FIG. 1 lies in that the latch circuit 11 is located before the selector 12. According to the configuration shown in FIG. 4, scan input data SI is latched by the latch circuit 11, based on an output signal of the controller 13, and output data of the latch circuit 11 is selectively transferred via the selector 12 to the following latch circuit 10.

Figure 5:
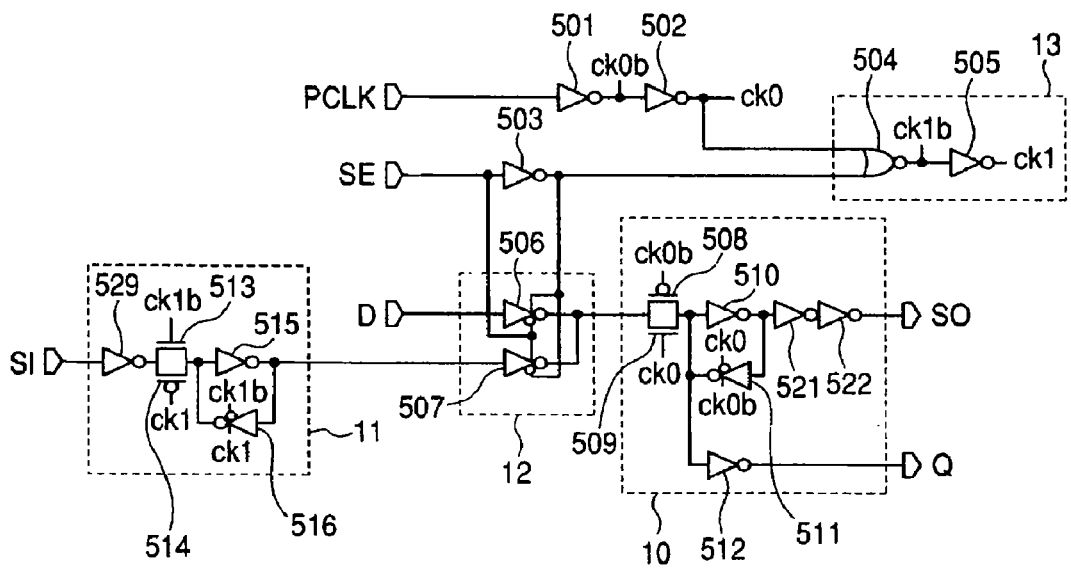
FIG. 5 is a circuit diagram showing an example of a detailed configuration including the structures of the components of the pulse latch circuit shown in FIG. 4.

FIG. 5 shows an example of a detailed configuration including the structures of the components of the pulse latch circuit 1 shown in FIG. 4.

This configuration is basically the same as that shown in FIG. 2. However, because the latch circuit 11 is located before the selector 12, in the configuration shown in FIG. 5, the latch circuit 11 does not have the inverter 517 (see FIG. 2); instead, it is provided with an inverter 529 immediately following the input of SI. The latch circuit 10 is provided with inverters 521, 522 for scan output. Even in this configuration, the same favorable effect as for the configuration shown in FIG. 1 can be obtained.

Figure 6:
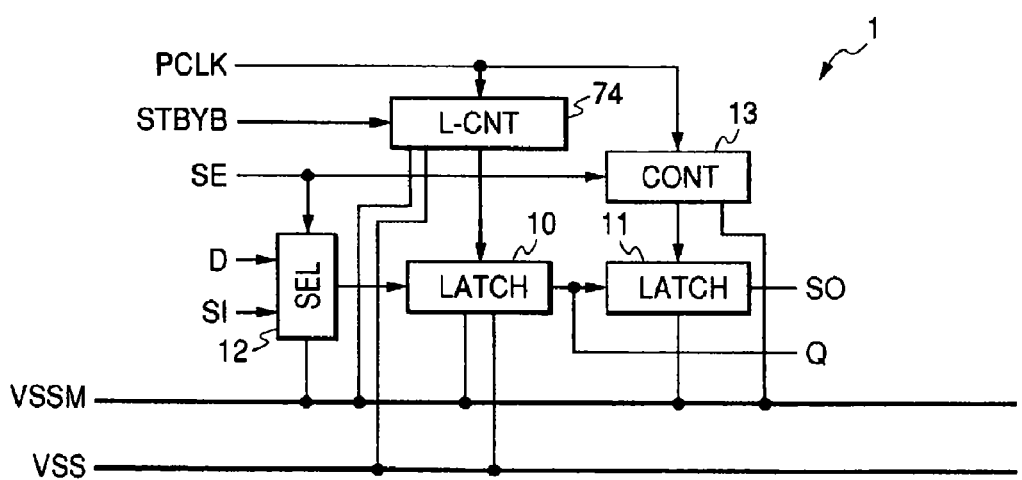
FIG. 6 is a block diagram showing yet another example of a configuration of a pulse latch circuit according to the present invention.

FIG. 6 shows yet another example of a configuration of a pulse latch circuit according to the present invention.

A significant difference between the pulse latch circuit shown in FIG. 6 and that shown in FIG. 1 lies in that there are separate power supply lines, namely, a low potential supply VSS line which carries current even during standby and a low potential supply VSSM line which does not carry current during standby and that a data retention control circuit (L-CNT) 74 is provided to have control to prevent the erasure of data latched by the latch circuit 10 during standby. The latch circuit 11, selector 12, and control circuit 13 are connected to the low potential supply VSSM line. The latch circuit 10 and data retention control circuit 74 are connected to both the low potential supply VSS line and the low potential supply VSSM line. The low potential supply VSS line and the low potential supply VSSM line can be on/off controlled by a power supply switch which is not shown. During normal operation, both the low potential supply VSS line and the low potential supply VSSM line are at the same potential. However, during standby, the low potential supply VSSM line is placed in a high impedance state.

Figure 7:
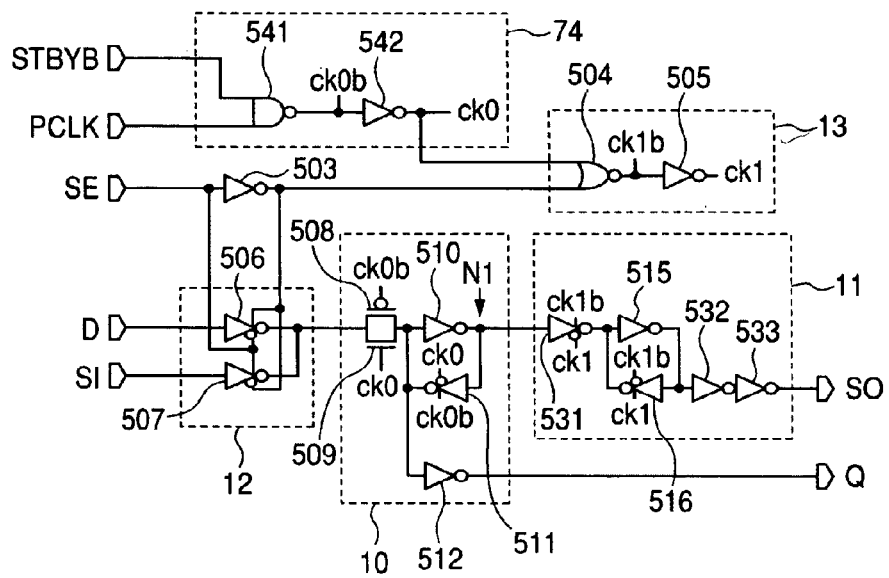
FIG. 7 is a circuit diagram showing an example of a detailed configuration including the structures of the components of the pulse latch circuit shown in FIG. 6.

FIG. 7 shows an example of a detailed configuration including the structures of the components of the pulse latch circuit shown in FIG. 6.

The data retention control circuit 74 includes a NAND gate 541 to produce a NAND logic between a standby signal STBYS and a pulse clock signal PCLK and an inverter 542 for logic inversion of an output of the NAND gate. The NAND gate 541 outputs a clock signal ck0b and the inverter 542 outputs a clock signal ck0. These clock signals ck0b, ck0 are used to control the operations of a p-channel MOS transistor 508, an n-channel MOS transistor 509, and a tristate buffer 511 in the latch circuit 10. An output of the latch circuit 10 appears on a node N1. Inverters 510, 511, 542 are supplied with a low potential supply voltage through the low potential supply VSS line and other devices are supplied with a low potential supply voltage through the low potential supply VSSM line. A semiconductor substrate (n-well, p-well), which is not shown, is connected to a high potential supply voltage VDD and a low potential supply voltage VSS during both normal operation and standby.

Figure 8:
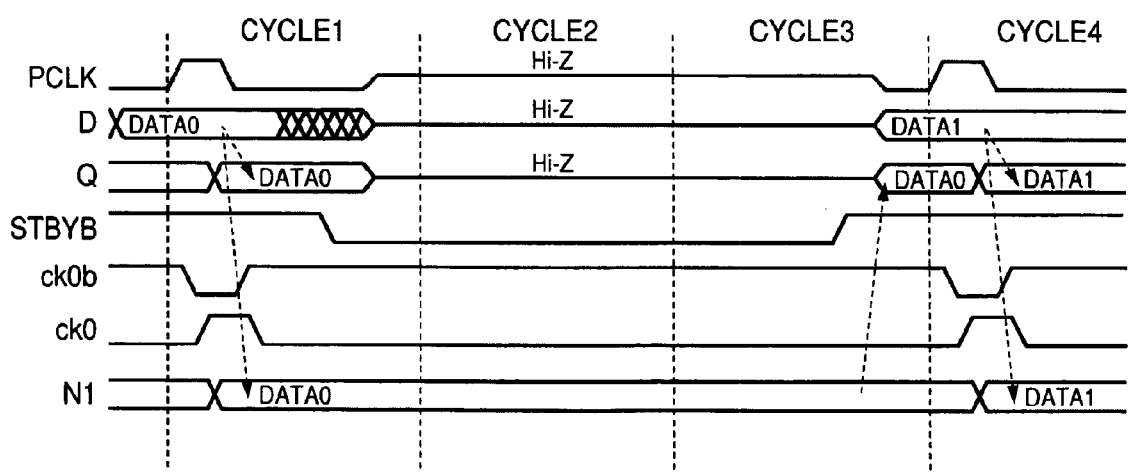
FIG. 8 is a timing chart for the operations of the main parts of the pulse latch circuit shown in FIGS. 6 and 7.

FIG. 8 shows timing for the operations of the main parts of the pulse latch circuit 1 shown in FIGS. 6 and 7.

For explanatory convenience, the following description concerns a state when the scan enable signal SE is L.

For CYCLE 1, a state when the standby signal STBYB is H corresponds to a normal operation mode. At this time, when the pulse clock signal PCLK is H, input data DATA0 is taken into the latch circuit 10, and is output as data (Q).

For CYCLE 2, a state when the standby signal STBYB is L corresponds to a standby mode. Input signals other than the standby signal STBYB are placed in a high-impedance state (Hi-Z). When the standby signal STBYB is L, the clock signal ck0b is fixed to H and the clock signal ck0 is fixed to L. Thereby, the transmission gate of the latch circuit 10 is controlled to be off. Since the inverter loop of the latch circuit 10 is connected t the low potential supply VSS line which always carries current, data DATA0 latched during CYCLE 1 is not lost even during the standby mode.

For a later part of CYCLE 3, when the standby signal STBYB becomes H and a return to normal operation mode occurs, DATA0 appears at the output data Q terminal where new data DATA1 is then captured as per normal in the next CYCLE 4. Here, eight transistors are always conductive for data retention and they represent only 20% of a total of 40 transistors employed in the whole pulse latch. Now, assuming that the percentage of the pulse latches in the whole semiconductor integrated circuit is 30%, the transistors that are on during standby represent 6% of the whole. Therefore, in terms of the amount of a leak current flowing during standby, it can be reduced by 94% as compared to a case where a power-off (sleep) mode is not applied. Furthermore, because the data latched by the latch circuit 10 is retained during standby, restoring data or similar operation is not needed and the time for a return from standby mode is shortened.

Figure 9:
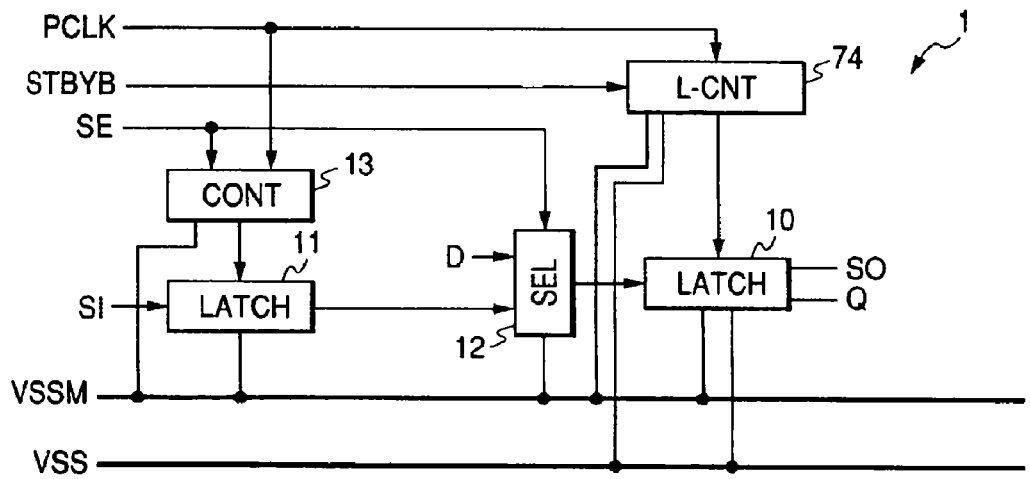
FIG. 9 is a block diagram showing a further example of a configuration of a pulse latch circuit according to the present invention.

FIG. 9 shows a further example of a configuration of a pulse latch circuit according to the present invention.

A significant difference between the pulse latch circuit shown in FIG. 9 and that shown in FIG. 6 lies in that the latch circuit 11 is located before the selector 12.

Figure 10:
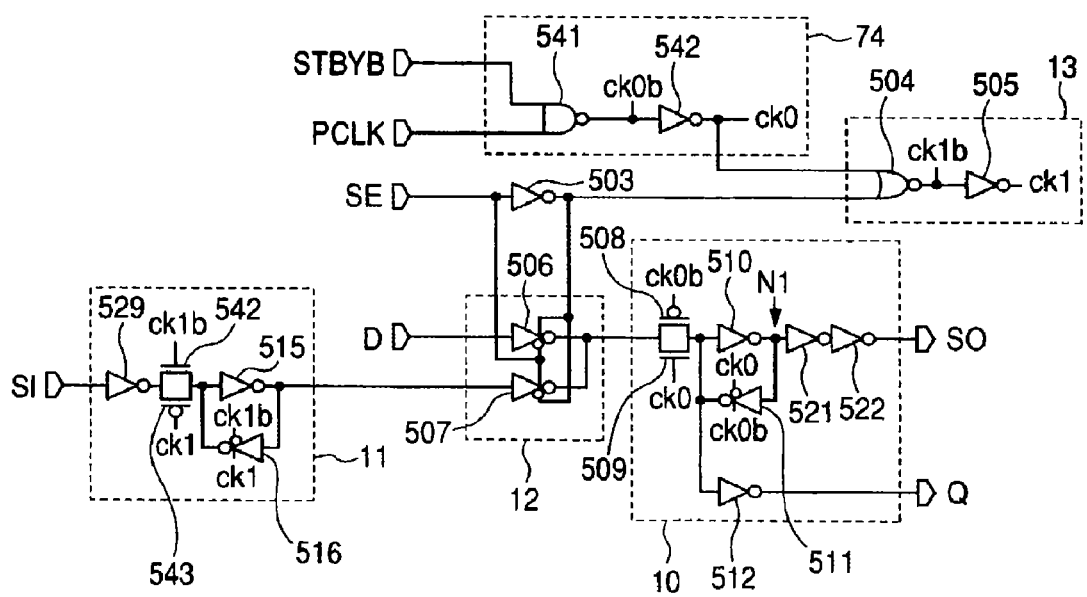
FIG. 10 is a circuit diagram showing an example of a detailed configuration including the structures of the components of the pulse latch circuit shown in FIG. 9.

FIG. 10 shows an example of a detailed configuration including the structures of the components of the pulse latch circuit 1 shown in FIG. 9.

This configuration is basically the same as that shown in FIG. 7. However, because the latch circuit 11 is located before the selector 12, in the configuration shown in FIG. 5, the latch circuit 11 does not have the inverters 532, 533 (see FIG. 7); instead, it is provided with an inverter 529 immediately following the input of SI. The latch circuit 10 is provided with inverters 521, 522 for scan output.

Even in this configuration, the same favorable effect as for the configuration shown in FIG. 6 can be obtained.

Figure 11:
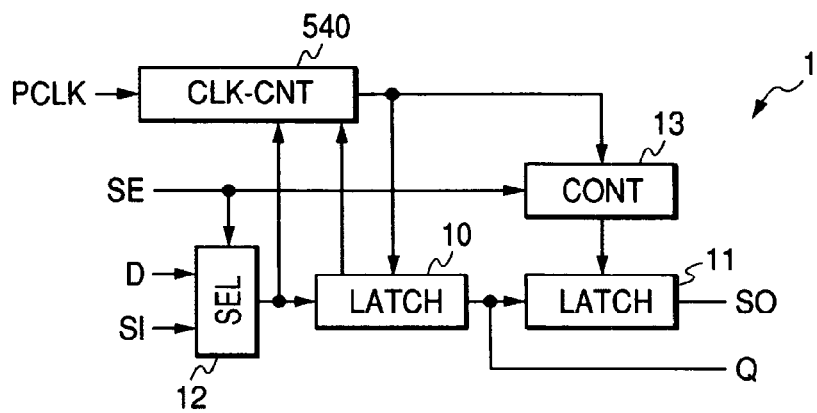
FIG. 11 is a block diagram showing a further example of a configuration of a pulse latch circuit according to the present invention.

FIG. 11 shows a further example of a configuration of a pulse latch circuit according to the present invention.

A significant difference between the pulse latch circuit shown in FIG. 11 and that shown in FIG. 1 lies in that a clock control circuit 540 is provided. The clock control circuit 540 compares data to be input to the latch circuit 10 and data latched by the latch circuit 10 and controls supplying a clock signal to the latch circuit 10, based on the result of the comparison. Specifically, the clock control circuit 540 supplies clock signals to the latch circuit 10, only when the data to be input differs from the data latched by the latch circuit 10. Because it is unnecessary to update the data latched by the latch circuit 10 when the data to be input matches the data latched by the latch circuit 10, the clock control circuit 540 stops the supply of clock signals to the latch circuit 10. A decrease in power consumption can be achieved by stopping the supply of clock signals to the latch circuit 10 when the data to be input matches the data latched by the latch circuit 10.

Figure 12:
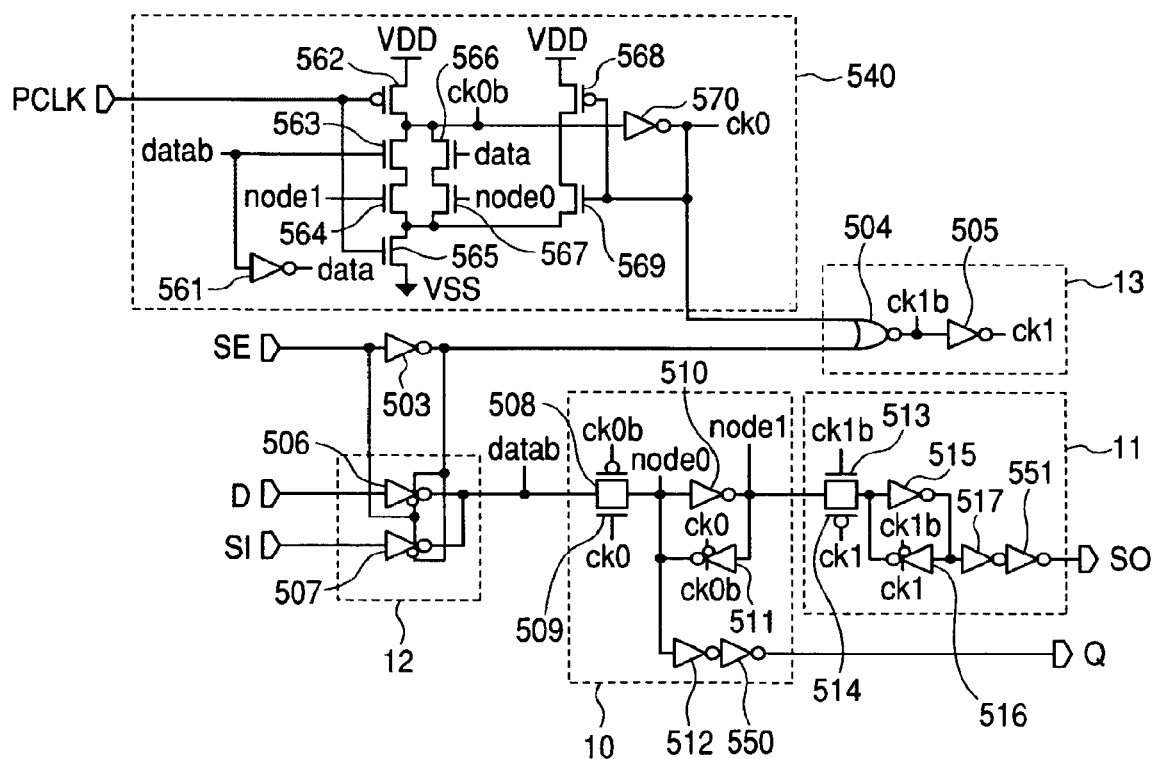
FIG. 12 is a circuit diagram showing an example of a detailed configuration including the structures of the components of the pulse latch circuit shown in FIG. 11.
Figure 13:
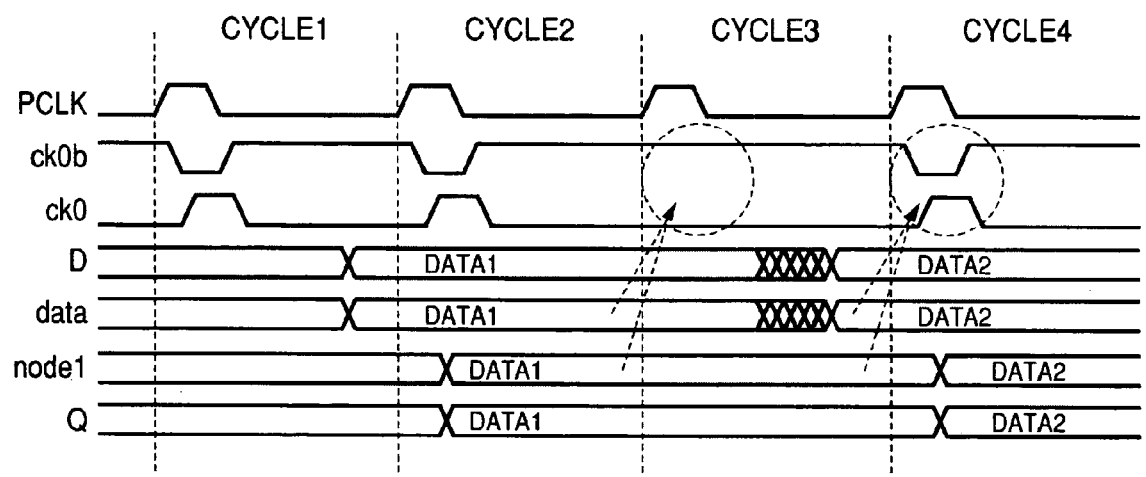
FIG. 13 is a timing chart for the operations of the main parts of the pulse latch circuit shown in FIGS. 11 and 12.

FIG. 12 shows an example of a detailed configuration including the structures of the components of the pulse latch circuit 1 shown in FIG. 11.

The clock control circuit 540 is configured as follows.

A p-channel MOS transistor 562 and n-channel MOS transistors 563, 564, 565 are connected in series. A series connection circuit consisting of n-channel MOS transistors 566, 567 is connected in parallel to a series connection circuit consisting of the n-channel MOS transistors 563, 564. A source electrode of the p-channel MOS transistor 562 is connected to a high potential supply voltage VDD and a source electrode of the n-channel MOS transistor 565 is connected to a low potential supply voltage VSS. The pulse clock signal PCLK is supplied to a gate electrode of the p-channel MOS transistor 562 and a gate electrode of the n-channel MOS transistor 565. Output data datab of the selector 12 is supplied to a gate electrode of the n-channel MOS transistor 563. An inverter 561 is provided for logic inversion of the output data (datab) of the selector 12 and output data (data) of the inverter 561 is transferred to a gate electrode of the n-channel MOS transistor 566. An output signal at one node node0 in the storing section of the latch circuit 10 is supplied to a gate electrode of the n-channel MOS transistor 567. An output signal at the other node node1 in the storing section of the latch circuit 10 is supplied to the n-channel MOS transistor 564. A clock ck0b is produced from a series connection node between the p-channel MOS transistor 562 and the n-channel MOS transistors 563, 566. An inverter 570 is provided for logic inversion of the clock signal ck0b and a clock signal ck0 is produced by the inverter 570. A p-channel MOS transistor 568 and an n-channel MOS transistor 569 are connected in series. A source electrode of the p-channel MOS transistor 568 is connected to a high potential supply voltage VDD. A source electrode of the n-channel MOS transistor 569 is connected to a series connection node between the n-channel MOS transistors 564, 567 and the n-channel MOS transistor 565. The clock ck0 output from the inverter 570 is transferred to a gate electrode of the p-channel MOS transistor 568 and a gate electrode of the n-channel MOS transistor 569. In this arrangement, the clock signals ck0b, ck0 are supplied to the latch circuit 10, only when data to be input differs from data latched by the latch circuit 10. The supply of the clock signals ck0b, ck0 to the latch circuit 10 is stopped, when the data to be input matches the data latched by the latch circuit 10.

Other circuits are the same as those shown in FIG. 2. In the latch circuit 10, an inverter 550 is provided after the inverter 512 and output data Q is output through this inverter 517. In the latch circuit 11, an inverter 551 is provided after the inverter 517 and scan output data SO is output through this inverter 551.

Figure 14:
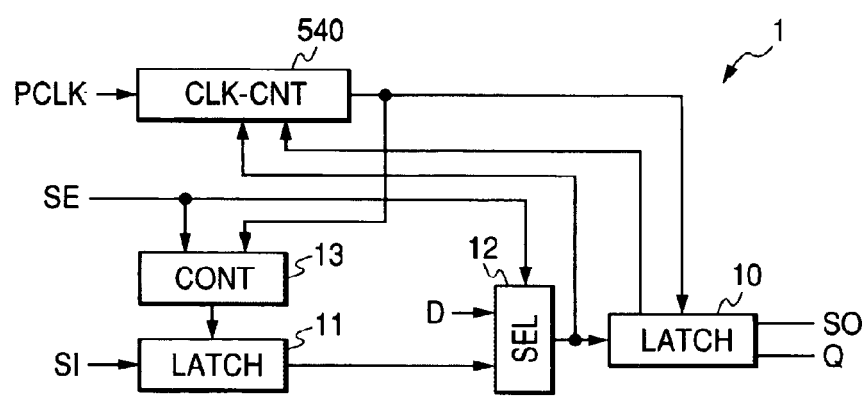
FIG. 14 is a block diagram showing a further example of a configuration of a pulse latch circuit according to the present invention.

FIG. 14 shows a further example of a configuration of a pulse latch circuit according to the present invention.

A significant difference between the pulse latch circuit 1 shown in FIG. 14 and that shown in FIG. 11 lies in that the latch circuit 11 is located before the selector 12. According to the configuration shown in FIG. 14, scan input data SI is latched by the latch circuit 11, based on an output signal of the controller 13 and output data of the latch circuit 11 is selectively transferred via the selector 12 to the following latch circuit 10.

Figure 15:
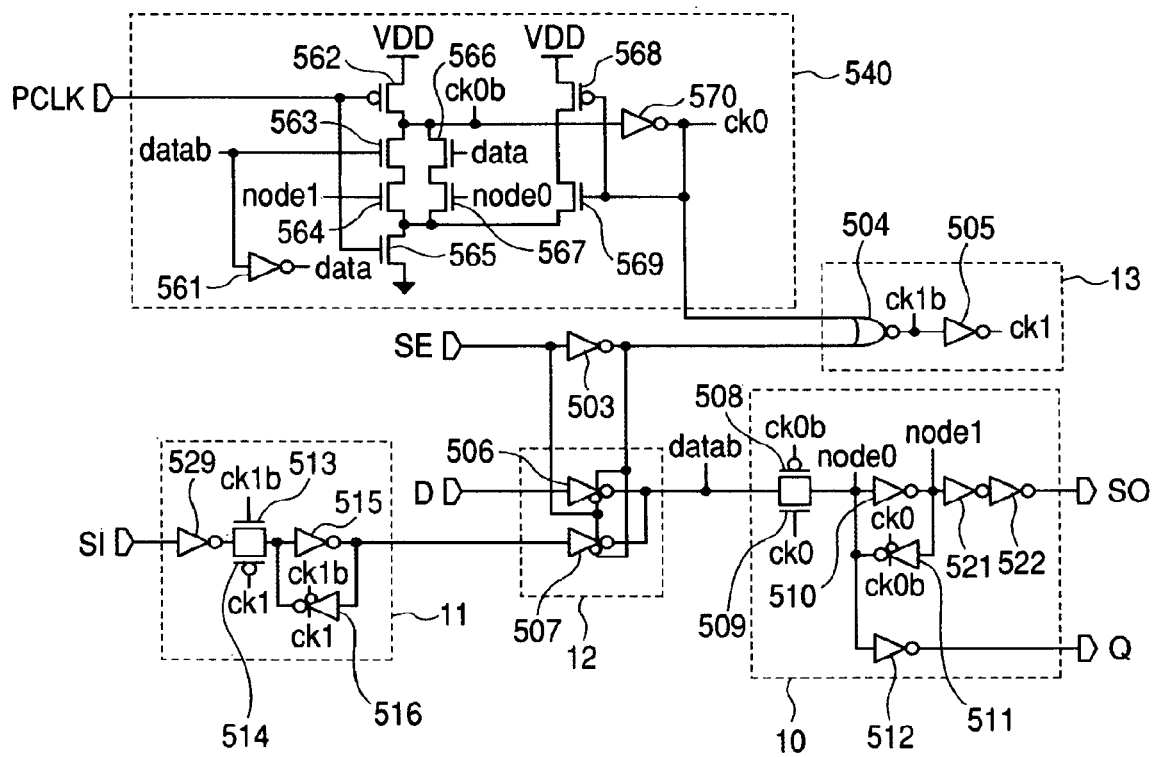
FIG. 15 is a circuit diagram showing an example of a detailed configuration including the structures of the components of the pulse latch circuit shown in FIG. 14.

FIG. 15 shows an example of a detailed configuration including the structures of the components of the pulse latch circuit 1 shown in FIG. 14.

This configuration is basically the same as that shown in FIG. 12. However, as the latch circuit 11 is located before the selector 12, in the configuration shown in FIG. 15, the latch circuit 11 does not have the inverters 517, 551 (see FIG. 12); instead, it is provided with an inverter 529 immediately following the input of SI. The latch circuit 10 does not have the inverter 550 (see FIG. 12), but is provided with inverters 521, 522 for scan output. Even in this configuration, the same favorable effect as for the configuration shown in FIG. 11 can be obtained.

Figure 16:
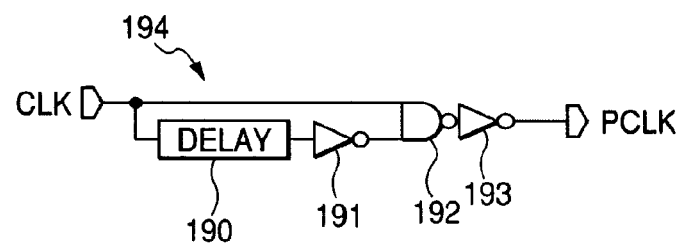
FIG. 16 is a circuit diagram showing an example of a configuration of a pulse generator for generating a pulse clock signal to be supplied to the pulse latch circuit.

FIG. 16 shows a pulse generator for generating the pulse clock signal PCLK.

The pulse generator 194 shown in FIG. 16 is comprised of, but is not limited to, a delay circuit (DELAY) 190, an inverter 191, a NAND gate 192, and an inverter 193. The delay circuit 190 delays a reference clock signal CLK with a duty of about 50%. An output signal of the delay circuit 190 is transferred via the following inverter 191 to the NAND gate 192. A NAND logic between the reference clock signal CLK and an output signal of the inverter 191 is produced by the NAND gate 192 and the thus produced signal is logically inverted by the following inverter 193 and output as a pulse clock signal PCLK.

Figure 17:
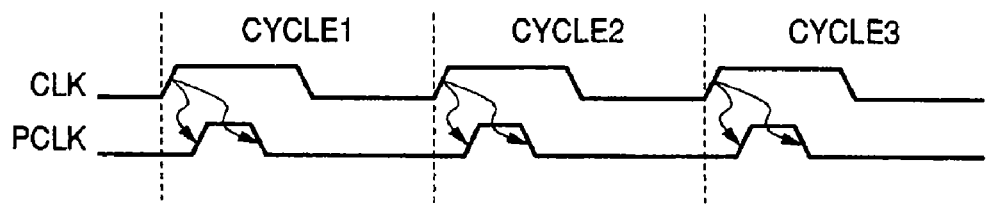
FIG. 17 is a timing chart for the operations of the main parts of the pulse generator shown in FIG. 16.

FIG. 17 shows timing for the operation of the pulse generator 194 shown in FIG. 16.

The rising timing and the falling timing of the pulse clock signal PCLK are synchronized with the rising timing of the reference clock signal CLK. The pulse width of the pulse clock signal PCLK can be adjusted by a delay time introduced by the delay circuit 190. The pulse generator can be configured so that the delay time introduced by the delay circuit 190 can be controlled externally.

Figure 18:
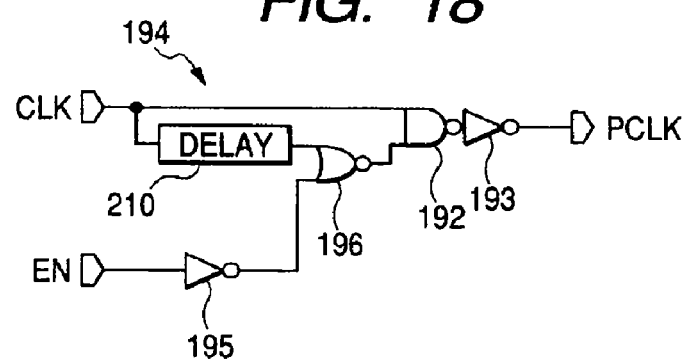
FIG. 18 is a circuit diagram showing another example of a configuration of a pulse generator for generating the pulse clock signal to be supplied to the pulse latch circuit.

FIG. 18 shows another example of a configuration of the pulse generator 194.

A difference between the pulse generator 194 shown in FIG. 18 and that show in FIG. 16 lies in that the pulse generator 194 is configured so that its operation can be controlled by an enable signal EN. The pulse generator 194 is provided with an inverter 195 for logic inversion of the enable signal EN supplied from the external and a NOR gate 196 which produces a NOR logic between an output signal of the inverter 195 and an output signal of the delay circuit 210. An output signal of the NOR gate 196 is transferred to the following NAND gate 192.

Figure 19:
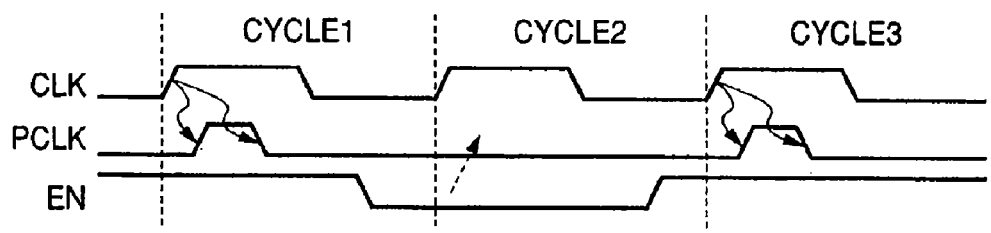
FIG. 19 is a timing chart for the operations of the main parts of the pulse generator shown in FIG. 18.

FIG. 19 shows the waveforms related to the operation of the pulse generator 194.

For CYCLE 1 and CYCLE 3, the enable signal EN is asserted to a high level and, therefore, the NOR gate 196 is activated and the pulse clock signal PCLK is generated. On the other hand, for CYCLE 2, the enable signal EN is negated to a low level and the NOR gate 196 is deactivated; consequently, the pulse clock signal PCLK is fixed to a low level.

Figure 20:
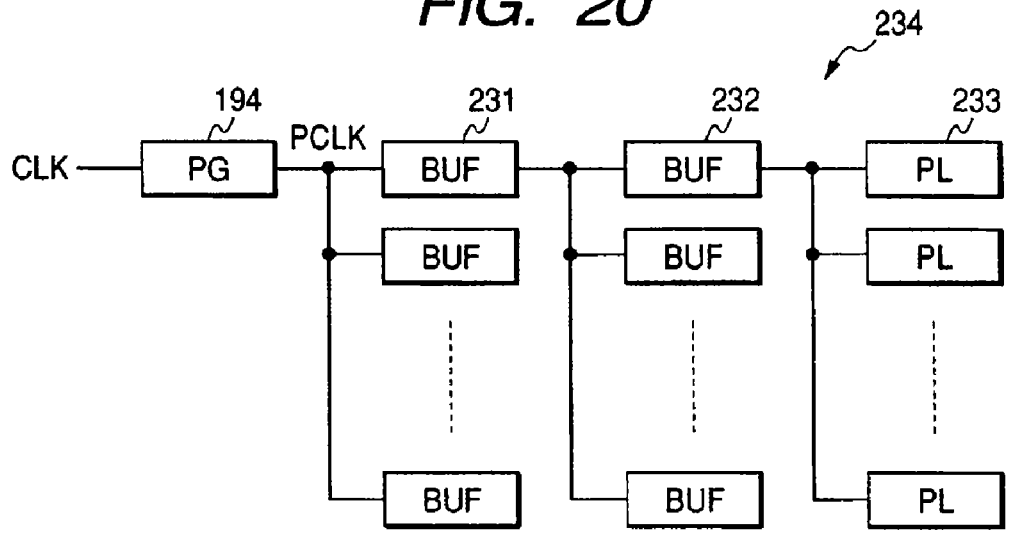
FIG. 20 is a block diagram showing an example of a configuration of a clock tree including the pulse generator.

FIG. 20 shows a clock tree for distributing clock signals.

The clock tree 234 shown in FIG. 20 is comprised of the pulse generator 194, a plurality of buffers (BUFs) 231, 232, and pulse latch circuits (PLs) 233. The pulse generator 194 configured as shown in FIG. 16 or FIG. 18 generates pulse clock signals PCLK. The generated pulse clock signals PCLK are distributed to the plurality of buffers 231, 232 and the pulse latch circuits 233. The plurality of buffers 231, 232 has a function to buffer the distributed pulse clock signal PCLK and supplies it to a subsequent circuit not shown. The pulse latch circuits 233 configured as shown in FIG. 1, FIG. 4, FIG. 6, FIG. 9, FIG. 11, or FIG. 14 may be adopted. By distributing the pulse clock signals PCLK by means of the clock tree 234 in this way, the number of the pulse generators 194 can be decreased.

Figure 21:
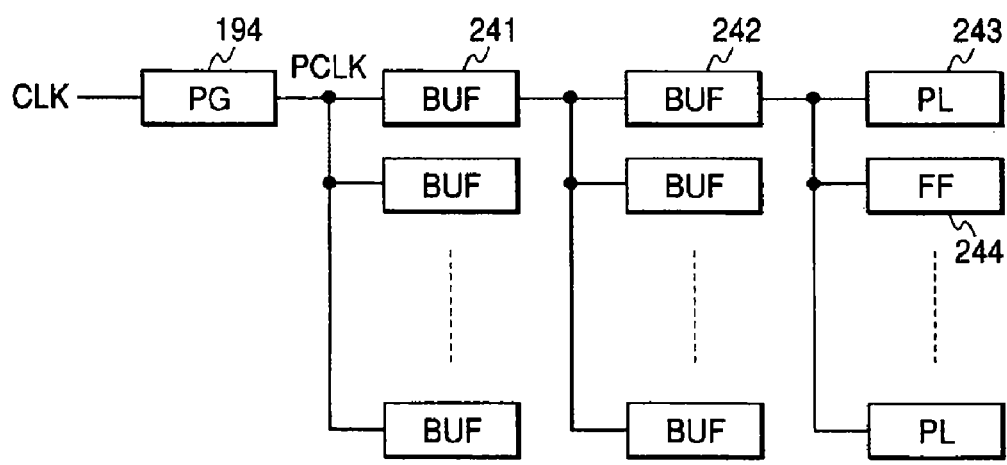
FIG. 21 is a block diagram showing another example of a configuration of a clock tree including the pulse generator.

FIG. 21 shows another clock tree for distributing clock signals.

As shown in FIG. 21, pulse latch circuits 243 and FF circuits 244 may coexist in the terminal portion of the clock tree 234. The pulse latch circuits 234 configured as shown in FIG. 1, FIG. 4, FIG. 6, FIG. 9, FIG. 11, or FIG. 14 may be adopted. An FF circuit 244 consists of a master lath and a slave latch and is equivalent of two pulse latch circuits.

Figure 22:
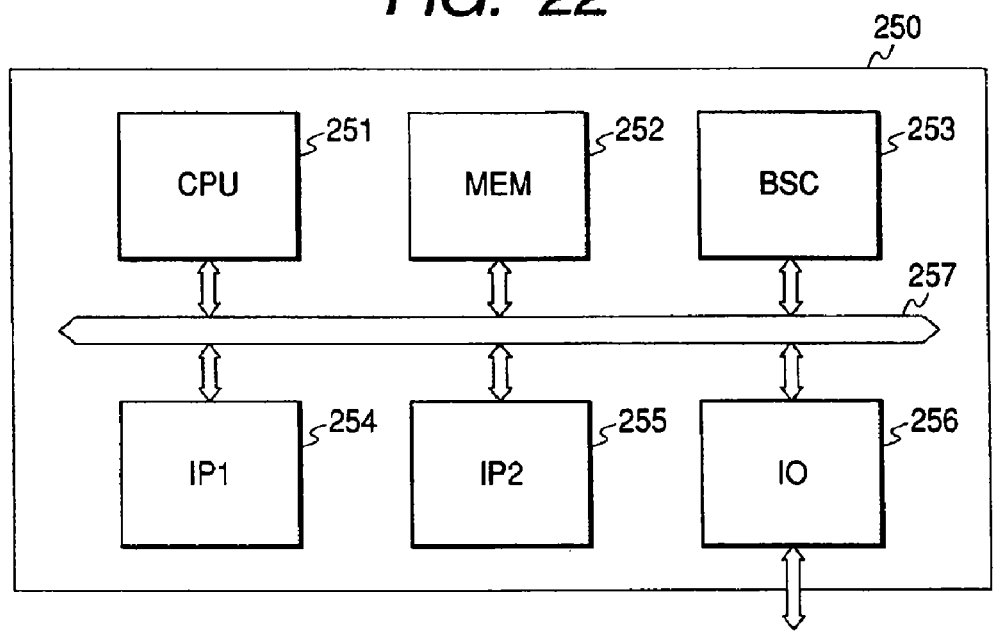
FIG. 22 is a block diagram showing an example of a configuration of a microcomputer as an example of a semiconductor integrated circuit according to the preset invention.

FIG. 22 shows a microcomputer as an example of a semiconductor integrated circuit according to the present invention.

The microcomputer 250 shown in FIG. 22 includes, but is not limited to, a plurality of functional modules and is formed on a single semiconductor substrate such as a monocrystalline silicon substrate by a publicly-known semiconductor integrated circuit manufacturing technique. The plurality of functional modules include a CPU (Central Processing Unit) 251, a memory (MEM) 252, a bus state controller (BSC) 253, an IP module (IP1) 254, an IP module (IP2) 255, and an I/O circuit (IO) 256, which are interconnected by a bus 257. The memory 252 includes a ROM (Read Only Memory) in which programs to be executed by the CPU 251 are stored and a RAM (Random Access Memory) which is used as a working area or the like for arithmetic processing by the CPU 251. The bus state controller 253 performs address space partitioning, outputting control signals according to the specifications of various memories and a bus state interface, and others. The IP (Intellectual Property) modules 254, 255 are functional modules respectively having certain functions such as, for example, a bus interface and a DMA (Direct Memory Access) controller, etc. The I/O circuit 256 enables transferring various kinds of data between the microcomputer 250 and an external device.

Pulse latch circuits 1 described above are incorporated in all or some of the plurality of functional modules. Specifically, a plurality of pulse latches are arranged as registers in each functional module and they are concatenated in a scan chain to enable the transfer of a test pattern for an operational test of each component of the module. According to such configuration, because the power consumption by the pulse latch circuits 1 is suppressed, it is achievable to decrease the whole power consumption of the microcomputer.

Figure 23A:
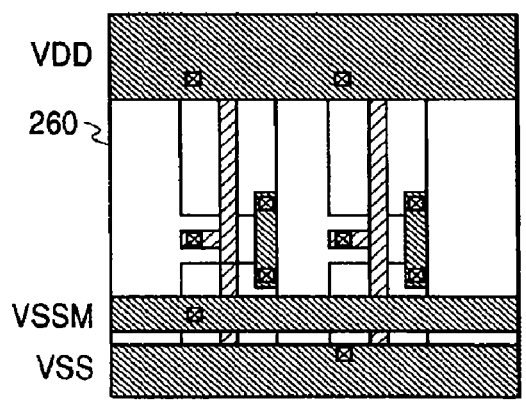
FIGS. 23A and 23B are illustrations of layout of a cell of the pulse latch circuit.
Figure 23B:
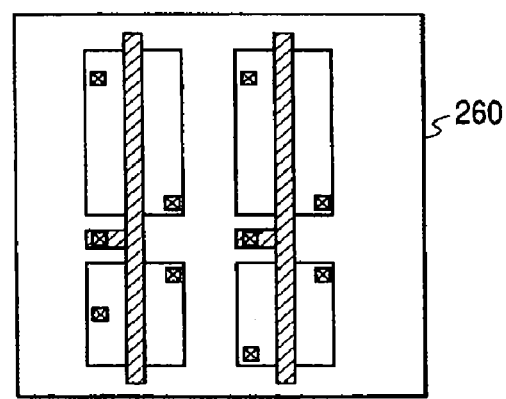

FIGS. 23A and 23B depict images of layout of a cell of the pulse latch circuit 1.

Power supply lines are formed, utilizing a top wiring layer of the cell. As shown in FIG. 23A, the power supply lines include a high potential supply VDD line formed in one margin of the cell 260 of the pulse latch circuit 1 and a low potential supply VSS line and a low potential supply VSSM line formed in parallel with the VDD line in the other margin of the cell 260. FIG. 23B shows an image of layout of the cell of the pulse latch circuit 1; wherein the power supply lines are omitted. Under the power supply lines, a combinational circuit of MOS transistors is formed, supplied with the operating voltages through the power supply lines.

Figure 24:
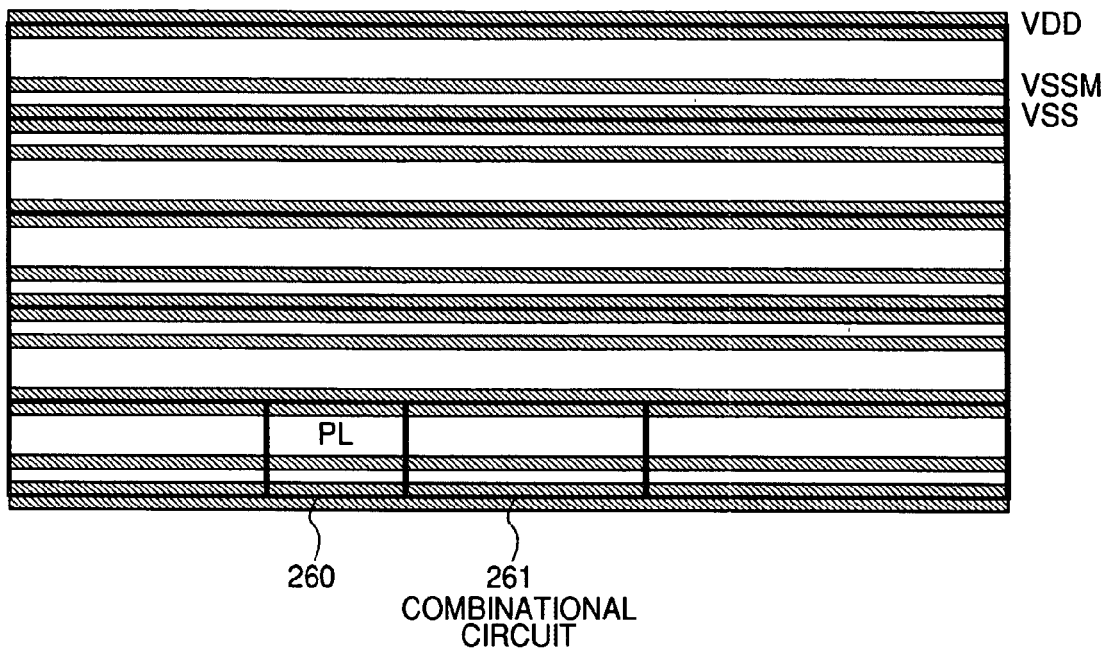
FIG. 24 is an illustration showing an example of placement of a cell including the pulse latch circuit shown in FIGS. 23A/23B.

FIG. 24 shows an example of placement of a cell including the pulse latch circuit 1 having the layout shown in FIGS. 23A/23B.

The cell 260 of the pulse latch circuit requires both the low potential supply VSS line and the low potential supply VSSM line within the cell. On the other hand, the cell 261 of the combinational circuit uses the low potential supply VSSM line within the cell, but does not use the low potential supply VSS line. However, as shown in FIGS. 23A/23B, the pulse latch circuit cell 260 includes both the low potential supply VSS line and the low potential supply VSSM line within the cell. By using this layout in common, the pulse latch circuit cell 260 and the combinational circuit cell 261 can arbitrarily be placed and it is therefore achievable to enhance the degree of freedom of layout. No extra work is added to the cell placement and wring process of the pulse latch circuit cell 260.

Figure 25:
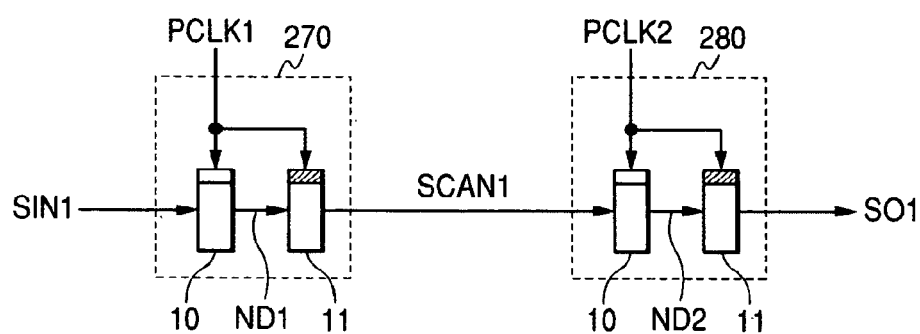
FIG. 25 is a block diagram showing an example of a configuration of a scan chain using the pulse latch circuits.

FIG. 25 shows a scan chain using pulse latch circuits described above.

The scan chain shown in FIG. 25 is formed by concatenating a first pulse latch circuit 270 which operates in sync with a pulse clock signal PCLK1 and a second pulse latch circuit 280 which operates in sync with a pulse clock signal PCLK2. Scan input data SIN1 is input to the first pulse latch circuit 270 and scan data SCAN1 from the first pulse latch circuit 270 is input to the second pulse latch circuit 280. Scan output data SO1 is produced by the second pulse latch circuit 280. The pulse latch circuit shown in FIG. 1, FIG. 6, or FIG. 11 may be applied for the first pulse latch circuit 270 and the second pulse latch circuit 280. However, in FIG. 25, only the latch circuits 10, 11 in the first pulse latch, circuit 270 and the second pulse latch circuit 280 are shown and other circuits, e.g., the selector 12 and the controller 13, are omitted. In the first pulse latch circuit 270, the output node of the latch circuit 10 is ND1. In the second pulse latch circuit 280, the output node of the latch circuit 10 is ND2.

Figure 26:
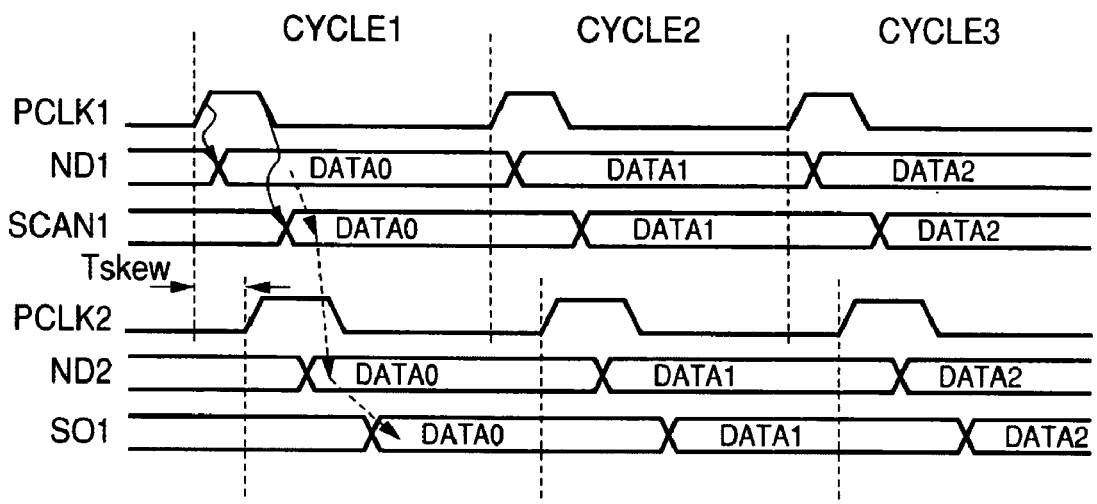
FIG. 26 is a timing chart for the operations of the main parts of the scan chain shown in FIG. 25.

FIG. 26 shows timing for the operations of the main parts of the scan chain shown in FIG. 25.

When the pulse clock signal PCLK1 becomes a high level, the latch circuit 10 is placed in a through state and scan input data SIN1 is output to the node ND1. Then, when the pulse clock signal PCLK1 changes to a low level, the latch circuit 11 is placed in a through state and the data on the node ND1 is transferred via the latch circuit 11 to the second pulse latch circuit 280. Here, consider that the pulse clock signal PCLK2 rises after a delay of Tskew after the rise of the pulse clock signal PCLK1. This corresponds to a clock skew Tskew existing between both signals. For CYCLE 1, when DATA0 appears in scan data SCAN1, the pulse clock signal PCLK2 remains at the high level. Therefore, the DATA0 is transferred to the node ND2. Then, when the pulse clock signal PCLK2 becomes the low level, DATA0 appears in scan output data SO1. It is meant that, due to the skew Tskew existing between the pulse clock signals PCLK1 and PCLK2, there is a possibility of the DATA0 passing through the two pulse latches during CYCLE 1, resulting in malfunction.

Figure 27:
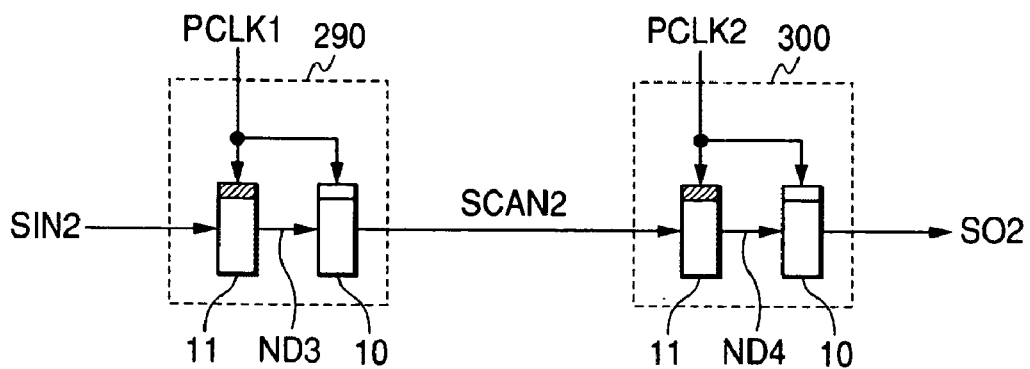
FIG. 27 is a block diagram showing another example of a configuration of a scan chain using the pulse latch circuits.

FIG. 27 shows another scan chain using the pulse latch circuits 1.

The scan chain shown in FIG. 27 is formed by concatenating a first pulse latch circuit 290 which operates in sync with a pulse clock signal PCLK1 and a second pulse latch circuit which operates in sync with a pulse clock signal PCLK2. Scan input data SIN2 is input to the first pulse latch circuit and scan data SCAN2 from the first pulse latch circuit is input to the second pulse latch circuit 300. Scan output data SO2 is produced by the second pulse latch circuit 300. The pulse latch circuit shown in FIG. 4, FIG. 9, or FIG. 14 may be applied for the first pulse latch circuit 290 and the second pulse latch circuit 300. However, in FIG. 27, only the latch circuits 10, 11 in the first pulse latch circuit 290 and the second pulse latch circuit 300 are shown and other circuits, e.g., the selector 12 and the controller 13, are omitted. In the first pulse latch circuit 290, the output node of the latch circuit 11 is ND3. In the second pulse latch circuit 300, the output node of the latch circuit 11 is ND4.

Figure 28:
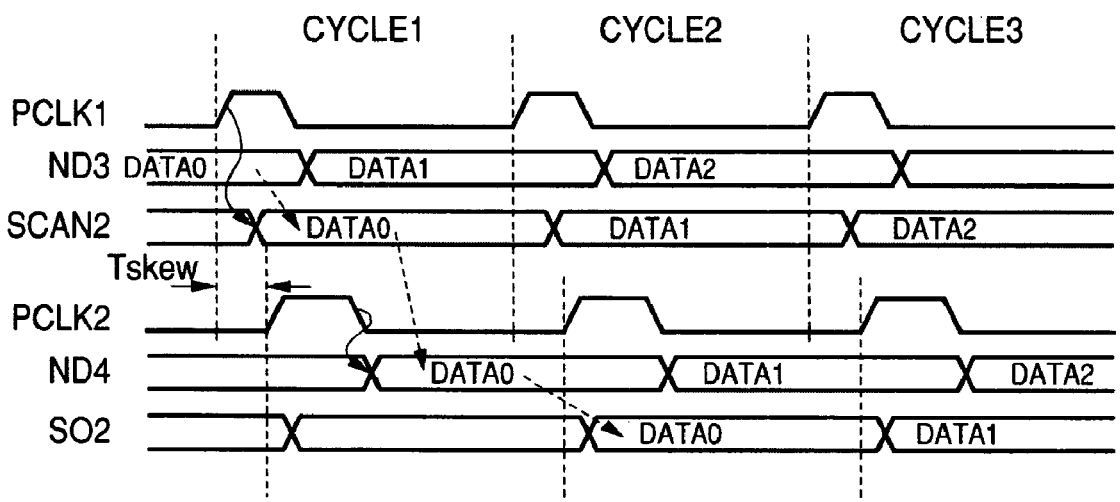
FIG. 28 is a timing chart for the operations of the main parts of the scan chain shown in FIG. 27.

FIG. 28 shows timing for the operations of the main parts of the scan chain shown in FIG. 27.

The following description focuses on CYCLE 1 in FIG. 28. When the pulse clock signal PCLK1 becomes the high level, DATA0 is output to SCAN2. The pulse clock signal PCLK2 rises after a delay of Tskew after the rise of the pulse clock signal PCLK1. When the pulse clock signal PCLK2 becomes the high level, the latch circuit 11 in the second pulse latch circuit 300 is immediately placed in a latch state. Thus, the DATA0, a value of scan data SCAN2 is not transmitted to the node ND4. When the pulse clock signal PCLK2 becomes the low level, the DATA0, a value of scan data SCAN2 is transferred to the node ND4 and, then, further transferred as scan output data SO2 at the timing of a rise of the pulse clock signal PCLK2 in CYCLE 2. In the configuration shown in FIG. 27, therefore, there is no possibility of the DATA0 passing through the two pulse latches during CYCLE 1. However, a very large clock skew may cause malfunction even if the configuration of FIG. 27 is applied; therefore, care should be taken. This caution is the same as taken in common design practice using FF circuits. As for a reasonable range of skews, it can be said that the configuration shown in FIG. 27 is more secure against the skew between the pulse clock signals PCLK1 and PCLK2 than the configuration shown in FIG. 25. In other words, as for a reasonable range of skews, the application of the pulse latch circuit shown in FIG. 4, FIG. 9, or FIG. 14 for the first pulse latch circuit 290 and the second pulse latch circuit 300 is regarded as more advantageous than the application of the pulse latch circuit shown in FIG. 1, FIG. 6, or FIG. 11.

While the invention made by the present inventors has been described specifically hereinbefore, it will be appreciated that the present invention is not limited to the described embodiments and various changes may be made without departing from the gist of the invention.

While, in the foregoing description, the invention made by the present inventors has been explained in relation to its application to microcomputers, which are regarded as the background usage field of the invention, the present invention is not so limited and can widely be applied to various semiconductor integrated circuits.

The present invention can be applied on the condition that shifting test pattern scan data is performed.

What is claimed is:

1. A pulse latch circuit that operates based on a clock signal, comprising:
a first operation mode in which shifting test pattern scan data is performed;
a second operation mode in which shifting said test pattern scan data is not performed;
input data latching means for storing input data based on said clock signal;
test pattern latching means coupled to said input data latching means and configured to store said test pattern scan data to be shifted based on said clock signal;
control means for supplying or not supplying said clock signal to said test pattern latching means during said second operation mode; and clock control means for comparing input data to be input to said input data latching means and input data stored by said input data latching means and for supplying or not supplying said clock signal to said input data latching means based on said comparison.

2. The pulse latch circuit according to claim 1,
wherein said clock control means prevents supplying said clock signal to said input data latching means when said input data to be input to said input data latching means matches said input data stored by said input data latching means.

3. The pulse latch circuit according to claim 1,
wherein said test pattern latching means is located upstream of said input data latching means, and wherein said pulse latch circuit further includes selecting means for selectively supplying an output signal of said input data latching means to said test pattern latching means.

4. The pulse latch circuit according to claim 1, further comprising:
a standby mode in which a partial shutdown of supply voltages takes place.

5. The pulse latch circuit according to claim 4, further comprising:
data retention means for preventing erasure of data stored by said input data latching means during said standby mode.

* * * * *